United States Patent [19]

Immel

[11] Patent Number: 4,949,867

[45] Date of Patent: Aug. 21, 1990

[54] AIR CONDITIONING DEVICE FOR A CONTROL PANEL

[75] Inventor: Manfred Immel, Mittenaar, Fed. Rep. of Germany

[73] Assignee: Rittal-Werk Rudolf Loh GmbH & Co. KG, Herborn, Fed. Rep. of Germany

[21] Appl. No.: 272,671

[22] Filed: Nov. 17, 1988

[30] Foreign Application Priority Data

Nov. 17, 1987 [DE] Fed. Rep. of Germany ....... 3738941

[51] Int. Cl.$^5$ .............................................. B65D 6/34
[52] U.S. Cl. .................................. 220/467; 220/4 R; 220/4 A
[58] Field of Search .......................... 220/4 R, 4 A, 18

[56] References Cited

U.S. PATENT DOCUMENTS

| | | | |
|---|---|---|---|
| 1,943,255 | 1/1934 | Booth | 220/4 F |
| 2,115,720 | 5/1938 | Holmes | 220/4 F |
| 2,775,500 | 12/1956 | Etherington | 220/4 R |
| 2,852,154 | 9/1958 | Brown | 220/18 |
| 2,930,834 | 3/1960 | Hose | 220/4 R |
| 3,107,025 | 10/1963 | Cowan | 220/18 |
| 3,872,995 | 3/1975 | Eickhorst | 220/4 R |
| 3,935,964 | 2/1976 | Saxe | 220/18 |

*Primary Examiner*—Stephen Marcus
*Assistant Examiner*—Stephen Castellano
*Attorney, Agent, or Firm*—Douglas H. Pauley; Thomas W. Speckman

[57] ABSTRACT

This invention relates to an air conditioning device, particularly for a control panel, having a box-like lower housing part and a box-like cover which can be connected therewith. The air conditioning device can be installed on or in a mounting wall in accordance with this invention. For installation on a mounting wall, the bottom of the lower housing part and the mounting wall have connecting elements for attaching the lower housing part to the mounting wall. The lower housing part and the cover each have open sides directed towards one another and each have inwardly directed peripheral edges on the side walls. The edges of the lower housing part are turned towards the cover and have solidly attached threaded bolts. The edges of the cover have corresponding through-holes mateable with the threaded bolts. A peripheral sealing strip is inserted between the edges of the lower housing part and the cover. In an air conditioning device installed into a cut-away section of the mounting wall, between the edges of the lower housing part and the sealing strip, the mounting wall has mounting through-holes around the cut-away section. The mounting through-holes are mateable with the threaded bolts which are secured with nuts. The cover is connected with the lower housing part with mounting bolts, which are secured to the cover. The mounting bolts are axially adjustable to a limited degree and each has a threaded reception mount which is mateable with a threaded bolt.

27 Claims, 3 Drawing Sheets

AIR CONDITIONING DEVICE FOR A CONTROL PANEL

BACKGROUND OF THE INVENTION

1. Field of the Invention

This invention relates to an air conditioning device, particularly for a control panel, with a box-like lower housing part and a box-like cover which can be connected with the lower housing part.

2. Description of the Prior Art

Similar types of air conditioning devices are normally attached to the doors or the side walls of the control panel. The entire air conditioning device is supported on one of the mounting walls. If such space is not available, the air conditioning device is then inserted, by means of an additional mounting framework, into a section of a mounting wall and the air conditioning device partially protrudes on both sides of the mounting wall.

SUMMARY OF THE INVENTION

It is one object of this invention to provide an air conditioning device which can be installed on a mounting wall as well as in a cut-away section of the mounting wall, without requiring an additional mounting framework.

According to one embodiment of this invention, an air conditioniong device installed on a mounting wall includes a lower housing part in the base. The mounting wall has connecting elements for screwing the lower housing part to the mounting wall. The lower housing part and the cover have, on open sides oriented towards one another, inwardly directed peripheral side wall edges. Threaded bolts are secured to the edges of the lower housing part of the cover. The edges of the cover have corresponding through-holes that are mateable with the threaded bolts. When the air conditioning device is installed on a mounting wall, a peripheral sealing strip is attached to the mounting wall between the edges of the lower housing part and the cover. When the air conditioning device is installed in a section of a mounting wall the wall section is positioned between the edges of the lower housing part and the sealing strip. The mounting wall has mounting through-holes around a cut-away section of the mounting wall and is secured with the threaded bolts by means of nuts. Mounting bolts are used to connect the cover with the lower housing part. The mounting bolts are secued in the cover and can be axially moved within threaded reception mountings that are screwed onto the threaded bolts.

By having a lower housing part and a cover, the installation on a mounting wall as well as the installation in a section of the mounting wall can be accomplished without additional mounting framework. The air conditioning device is sealed in an area of the connection between the lower housing part and the cover, so that the function of the air conditioning device is not impaired. The cover can be independently removed without the air conditioning device being removed from the mounting wall. This is an important aspect for maintenance of the air conditioning device.

According to one embodiment of this invention, the assembled mounting wall has mounting through-holes that acommodate the connecting elements and two ventilation opening which allow an exchange of air between the control panel and the air conditioning device.

According to another embodiment of this invention, the lower housing part cn be secured to the mounting wall using connection elements, which can be constructed as threaded rivets, in the base of the lower housing part. Threaded studs are mateable with the threaded rivets. The mounting through-holes of the mounting wall are mateable with the threaded studs and the mounting wall is held thereon by nuts.

The connection between the lower housing part and the mounting wall is sealed by a peripheral sealing strip which is attached between the mounting wall and the lower housing part.

The side walls of the lower housing part have, in connection with the inwardly directed edges, end sections directed outwardly and parallel to the side walls. The end sections cover the connecting area between the lower housing part and the cover. The end sections form a framework which defines the installation level or the dimensions of the cutout section in the mountig wall. During installation, the cutout section of the mounting wall is adjusted to the external dimensions of the end section of the side walls of the lower housing part. The mounting through-holes around the cutout section of the mounting wall are aligned with the threaded bolts secured to the edges of the side walls of the lower housing part.

When assembling the air conditioning device, the mounting through holes are aligned with the connection elements in the base of the lower housing part. The connecting elements can be threaded rivets. The connection elements are non-rotatable and extend through-holes in the base of the lower housing part so that the threaded studs can be easily rotated into place. A cap screw can also be used for the connection.

According to one embodiment of this invention, positioning of the mounting bolts in the cover in a tight, adjustable, axially limited and rotatable manner is achieved by having the mounting bolts of the cover supported in U-shaped guide brackets. The U-shaped guide brackets are attached on the internal side walls of the cover. The mounting bolts fit within through-openings of a side arm of a guide bracket. Axial adjustment of the mounting bolts is limited by safety elements which are attached to the mounting bolts. The threaded reception mounts for receiving the threaded bolts of the lower housing part are installed in the front sides of the threaded bolts which are oriented to the lower housing part. The ends of the mounting bolts have a slot and are oriented to the top wall of the cover. The mounting bolts are accessible through-holes in the cover wall.

The elements of the air conditioning device are distributed so that all components, such as compressors, condensers, vaporizers, ventilators and the like, are positioned in the lower housing part. Elements used for air guidance and air purification, such as filter mattings and the like, are accommodated in the cover.

The lower housing part accommodates elements which are connected or coupled with one another. The elements within the cover cannot be wired or similarly connected to the elements of the lower housing part so that the cover can easily be removed from the lower housing part.

BRIEF DESCRIPTION OF THE DRAWINGS

This invention is illustrated in greater detail by means of certain embodiments shown in the drawings wherein.

DESCRIPTION OF THE PREFERRED EMBODIMENTS

Figure 1:
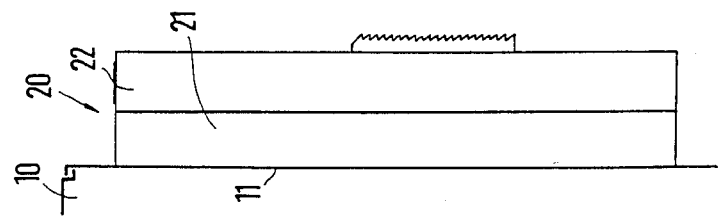
FIG. 1 shows a side view of a wall mounted air conditioning device having a lower housing part and a cover according to one embodiment of this invention.

The side view of FIG. 1 shows the control panel (10) in the area of the mounting wall (11) which may be a control panel door or a side wall of a control panel body. The air conditioning device (20) includes the lower housing part (21) and the cover (22). In one embodiment, the lower housing part (21) accommodates all components or elements such as a compressor, a liquefier, a vaporizer, ventilators and the like. Such elements can be connected in series and coupled with one another. In the cover (22), only elements such as those used for air guidance and air purification, such as filter mattings and the like, are positioned so that the cover (22) can be easily removed from the lower housing part (21). In one embodiment, the air conditioning device (20) is positioned at a distance from the mounting wall (11).

Figure 2:
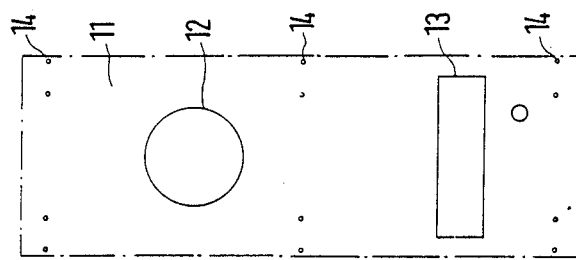
FIG. 2 shows a front view of openings in the mounting wall for mounting the air conditioning device according to the mounting shown in FIG. 1.

The pattern for the openings in mounting of the air conditioning device (10) is shown in FIG. 2. The mounting through-holes allow threaded connections with connectiong elements of the lower housing part (21). Connecting elements on the mounting wall (11) and the base of the lower housing part (21) are adjusted and coordinated with one another. Ventilation openings (12 and 13) in the mounting wall (11) allow for air exchange between the control panel (10) and the air conditioning device (20).

Figure 3:
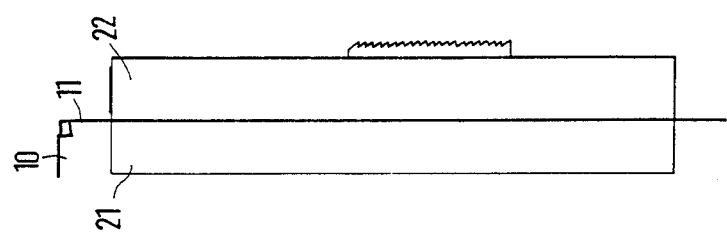
FIG. 3 shows a side view, in a cut-away section of a mounting wall, of a partial installation of an air conditioning device having a lower housing part and a cover according to another embodiment of this invention.

The side view of FIG. 3 only shows the control panel (10) in the area of the mounting wall (11) which can also be a control panel door or a side wall of the panel body. During installation of the air conditioning device (20) into the cut-away section (15) of the mounting wall (11), the lower housing part (21) essentially projects on the internal side of the control panel (10). The cover (22) projects on the external side of the mounting wall (11). The mounting through-holes (14) are positioned around the cut-away section (15) in the mounting wall (11) and aligned with the connecting elements. The connecting elements are positioned in the connecting area between the lower housing part (21) and the cover (22), as will be further described in this specification.

Figure 5:
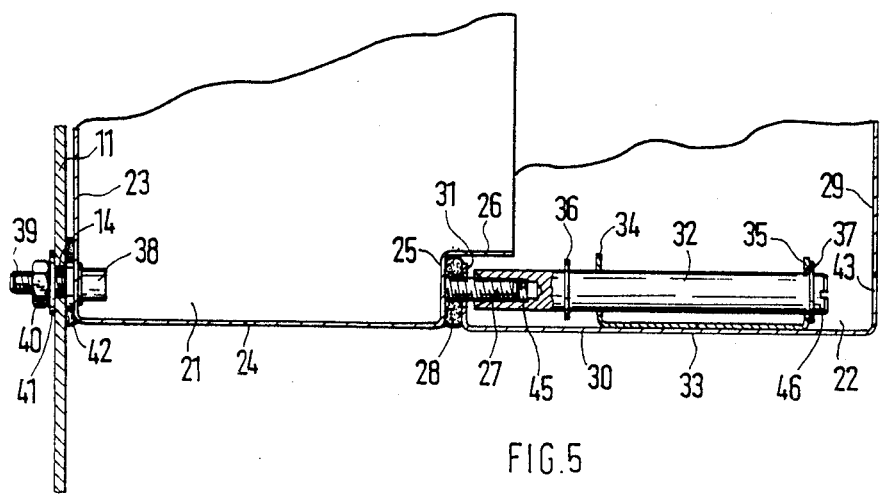
FIG. 5 shows a partial cross-sectional view of the connection between the mounting wall and the lower housing part and the connection between the lower housing part and the cover of an air conditioning device attached to a mounting wall according to one embodiment of this invention.

Mounting of the air conditioning device (20) to the mounting wall (11) is illustrated in greater detail in the partial cross-sectional view of FIG. 5. The threaded studs (39), set in openings in a tight and non-rotatable manner are provided in the base (23) of the box-like, lower housing part (21). The threaded studs (39) are distributed in the area of the side wall (24) of the lower housing part (21) aligned with the pattern of openings in the mounting through-holes (14) of FIG. 2 so that the lower housing part (21) can be repeatedly attached to and disassembled from the mounting wall (11). The sealing strip (42) between the mounting wall (11) and the base (23) of the lower housing part (21) is peripherally positioned through all the connecting points. The sealing strip (42) provides a positive seal between the mounting wall (11) and the lower housing part (21). The threaded studs (39), which are positioned through the mounting through-holes (14) of the mounting wall (11) are mateable with the threaded rivets (38). The washer (41) and the nuts (40) are mateable with the threaded studs (39) and are used to holde the air conditioning device (20) to the mounting wall (11). Instead of the threaded studs (39) and the nuts (40), head screws can also be used and be screwed from the control panel internal space through the mounting through-holes (14) and into the threaded rivets (38).

Figure 4:
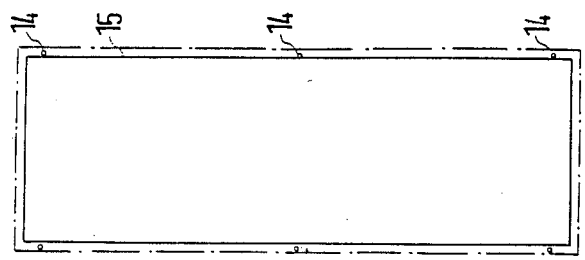
FIG. 4 shows a front view of openings in the mounting wall for the installation of the air conditioning device according to the mounting shown in FIG. 3.

The side walls (24 and 30) of the lower housing part (21) and the cover (22), respectively, have the edges (25 and 31) on the internal periphery. Threaded bolts (27) are secured, such as being welded, on the side of the edges (25) of the lower housing part (21) turned towards the cover (22). The pattern of the mounting through-holes (14) of the mounting wall (11) is arranged as shown in FIG. 4. The edges (31) of the side walls (30) of the cover (22) have holes distributed such that the edges (31) can be positioned over the threaded bolts (27). The sealing strip (28), which seals the connecting area between the lower housing part (21) and the cover (22), is peripherally positioned between the edges (25 and 31). The cover (22) is supported by mounting bolts (32) which are provided with threaded reception mounts (45) on the front side oriented to the lower housing part (21). The threaded reception mounts (45) can be screwed onto the threaded bolts (27). The mounting bolts (32) extend through the side arms (34 and 35) of the U-shaped guide brackets (33). The mounting bolts (32) are rotatable and axially adjustable to a limited extent in that the safety elements (36 and 37) attached to the mounting bolts (32) limit the axial adjustment movement. The mounting bolts (32) are serviced and maintained by means of the openings (43) in the top wall (29) of the cover (22) and the end (46) which has a slot. The mounting bolts (32) are distributed and aligned with the threaded bolts (27). The guide brackets (33) are secured to the inner side walls (30) of the cover (22).

The edges (25) of the lower housing part (21) make a transition into peripheral end sections (26) which cover the connection area between the lower housing part (21) and the cover (22). The end secations (26) form a framework, the external dimensions of which define the cut-away section in the mounting wall (11) for installation of the air conditioning device (20) according to FIG. 3.

Figure 6:
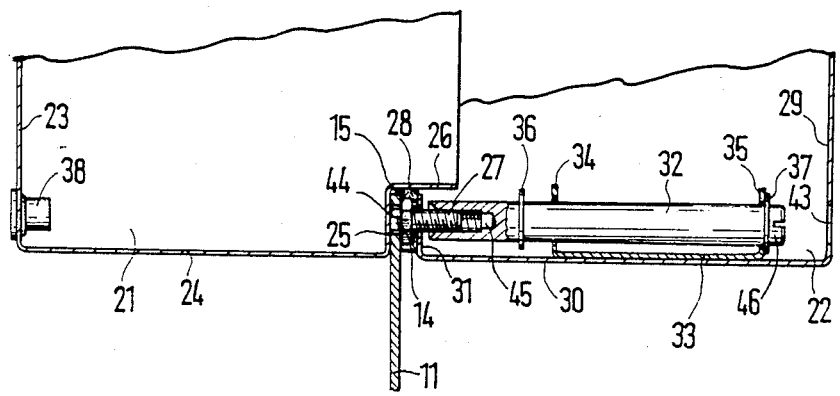
FIG. 6 shows a partial cross-sectional view of the connection between the lower housing part, the mounting wall and the cover of an air conditioning device installed in a cut-away section of the mounting wll according to another embodiment of this invention.

An installation according to one embodiment of this invention is shown in the partial cross-sectional view of FIG. 6. As shown in FIG. 6, the lower housing part (21) is positioned on an internal side of the mounting wall (11) and secured by means of the threaded bolts (27) which extend through not shown in FIG. 6 the mounting through-holes (14) of the mounting wall (11). The nuts (44) are positioned on the internal side of the mounting nuts 44 shown on external side wall (11). The cover (22) is attached to the lower housing part (21), as shown in the mounting according to FIG. 5, by means of the threaded bolts (27) and the mounting bolts (32). Referring to FIG. 5, the pattern of the mounting through-holes (14) of the mounting wall (11) having the cut-away section (15) corresponds to the distribution of the threaded bolts (27) and the mounting bolts (32). As shown in FIGS. 5 and 6, the peripheral sealing strip (28) is used to seal the connecting area between the lower housing part (21) and the cover (22). The sealing strip (28) is positioned between the mounting wall (11) and held in position with the nuts (44) and the edges (31) of the side wall (30) of the cover (22).

The lower housing part (21) having the threaded rivets (38) and the threaded bolts (27) on the edges of the lower housing part (21) in connection with the mounting bolts (32) of the cover (22) provide a selectable assembly or installation of the air conditioning device (20). The lower housing part always remains connected with the mounting wall (11), if the cover (22) of the air conditioning device (20) is removed for maintenance.

Figures 7, 8:
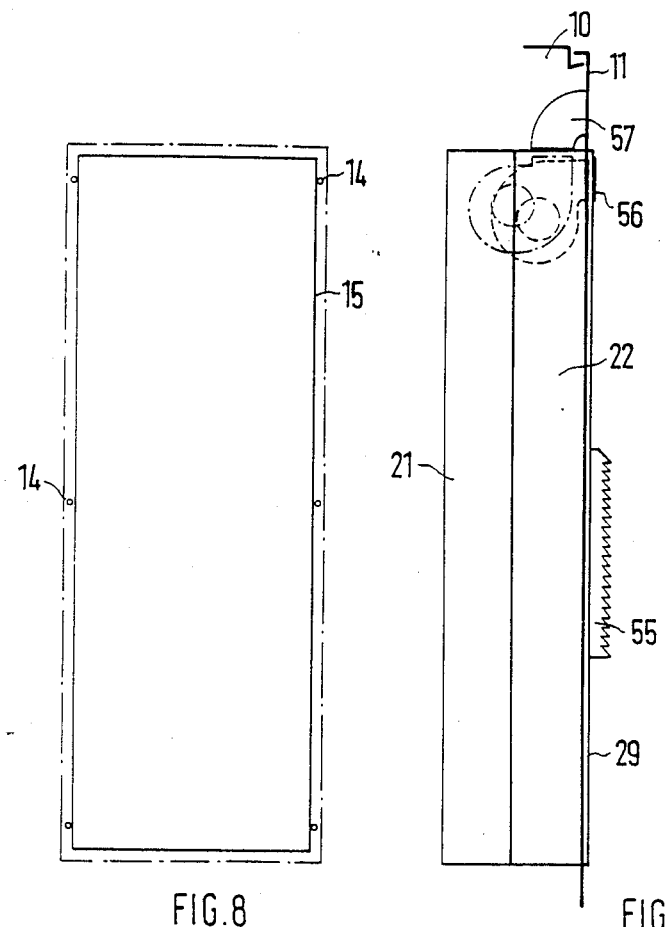
FIG. 7 shows a side view of an installation of an air conditioning device, having a lower housing part and a cover subdivided into a frame-like part and a separate cover wall, in a cut-away section of a mountig wall, according to one embodiment of this invention.
FIG. 8 shows a front view of openings in the mounting wall for the complete installation of the air conditioning devcie according to one embodiment of this invention.

The side view of FIG. 7, according to one embodiment of this invention, shows that the air conditioning device (20) can be completely installed so that only the covering wall (29) projects with one edge on the external side of the mounting wall (11). Air circulation can thereby selectively flow from entrance (55) either through the cover wall (29) or the mounting wall (11) to the discharge (56 or 57), shown as blowers which are indicated by the dashed lines.

FIG. 8 shows the pattern of openings in the mounting wall (11). The pattern remains the same as in the partial installation of the air conditioning device (20) according to FIGS. 3 and 4.

Figure 9:
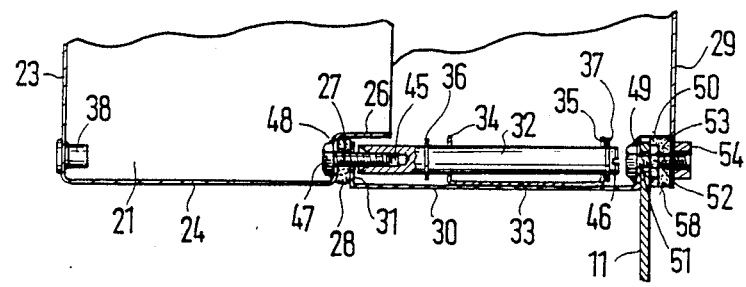
FIG. 9 shows a partial cross-sectional view of the lowe housing part and the frame-like part of the cover, both between the framework part and the separate top wall of the cover.

For maintenance purposes, the air conditioning device (20) can remain attached with its components to the mounting wall (11). The top wall (29) is separate from the cover (22) so that the top wall (29) can be independently removed from the remaining part of the cover (22). The connection between the lower housing part (21) and the frame-like part of the cover (22) is the same as the assembly of the air conditioning device in accordance with FIS. 1, 2 and 5. Referring to FIG. 9, facing the top wall (29), the frame-like part of the cover (22) has Z-shaped edge whereby the inwardly-directed edges (49) project vertically to the framework wall and make a transition into the end section (50) which is directed parallel to the framework wall. The end section (50) covers the connecting part between the frame-like part and the separate top wall (29) of the cover (22).

The threaded studs (51) are secured, preferably by welding, to the peripheral edges (49). The threaded studs (51) may be cap screws and they extend through openings in the peripheral edges (49). The head (47) of the threaded bolts (27) can be welded at the welding seam (48). The threaded studs (51) can in the same way be welded to the peripheral edges (49) and protrude on the peripheral edges (49) in a direction toward the top wall (29). The top wall (29) has a peripherally edged border (58) which supports openings on the peripheral edges (49). A circumferential sealing band (53) is positioned between the peripheral edge (49) of the mounting wall (11) and the top of the wall (29). The threaded studs (51) extend through the openings to the external side of the top wall (29). The threaded studs (51) extend through the mounting through-holes (14) of the mounting wall (11) such that the nuts (52) which are mateable with the threaded studs (51) are used to attach the lower housing part (21) and the frame-like part of the cover (22) to the mounting wall (11). In front of the top wall (29), the internal side of the top wall (29) is connected to the mounting wall (11) with the nuts (54). By loosening without removing from the mounting wall (11) the frame-like part of the cover (22) and the lower housing part (21) connected to the top wall (20). Such removable top wall (29) facilitates the maintenance of an installed air conditioning device (20).

I claim:

1. An air conditioning device for a control panel having a lower housing part and an attachable cover for installation on a mounting wall (11), the air conditioning device comprising:

said lower housing part (21) having a base (23), a plurality of connecting elements for securing said lower housing part (21) to the mounting wall (11);

said lower housing part (21) having a housing open side, said cover (22) having a cover open side oriented towards said housing open side, a housing side wall (24) of said lower housing part (21) having an inwardly directed peripheral housing edge (25) on said housing open side, a cover side wall (30) of said cover (22) having an inwardly directed peripheral cover edge (31) on said cover open side;

said peripheral housing edge (25) of said lower housing part (21) oriented towards said cover (22) and a plurality of threaded bolts (27) secured to said peripheral housing edge (25), said cover edge (31) of said cover (22) having corresponding openings each mateable with each said threaded bolt (27);

a peripheral sealing strip (28) mounted between said cover edge (31) of said cover (22) and said peripheral housing edge (25) of said lower housing part (21) during the installation of the air conditioning device (20); and said cover (22) connectable with said lower housing part (21), a plurality of mounting bolts (32) each having a threaded reception mount (45), each said threaded bolt (27) secured to said cover (22) and mateable with each said threaded reception amount (45), and each said threaded reception mount (45) being axially adjustable.

2. An air conditioning device in accordance with claim 1, wherein the mounting wall (11) has two ventilation openings (12, 13) for connecting air conditioning device components.

3. An air conditioning device in accordance with claim 2, wherein said lower housing part (21) is attached to the mounting wall (11) with said connecting elements, each said connecting element in said base (23) of said lower housing part (21) is a threaded rivet (38) which is mateable with each of a plurality of threaded studs (39), and each of a plurality of mounting through-holes (14) is mateable with each corresponding said threaded stud (39), and said lower housing part (21) is attached to the mounting wall (11) with a plurality of threaded nuts (40) each mateable with each corresponding said threaded stud (39).

4. An air conditioning device in accordance with claim 3, wherein a peripheral sealing strip (42) is mounted between the mounting wall (11) and said lower housing part (21).

5. An air conditioning device in accordance with claim 4, further comprising:
    said inwardly directed peripheral housing edge (25) of said housing side wall (24) having end sections (26) directed toward said cover (22) and parallel to said housing side wall (24) and said end sections (26) overlapping a connecting area between said lower housing part (21) and said cover (22).

6. An air conditioning device in accordance with claim 5, wherein said mounting through holes (14) of the mounting wall (11) are adjusted to correspond with a distribution of said connecting elements in said base (23) of said lower housing part (21), and said connecting elements each comprise said threaded rivets (38).

7. An air conditioning device in accordance with claim 6, wherein said threaded rivets (38) are non-rotatably secured in borings of said base (23) of said lower housing part (21).

8. An air conditioning device for a control panel having a lower housing part and an attachable cover for installation on a mounting wall (11), the air conditioning device comprising:
    said lower housing part (21) having a base (23);
    said lower housing part (21) having a housing open side, said cover (22) having a cover open side oriented towards said housing open side, a housing side wall (24) of said lower housing part (21) having an inwardly directed peripheral housing edge (25) on said housing open side, a cover side wall (30) of said cover (22) having an inwardly directed peripheral cover edge (31) on said cover open side;
    said peripheral housing edge (25) of said lower housing part (21) oriented towards said cover (22) and a plurality of threaded bolts (27) secured to said peripheral housing edge (25), said cover edge (31) of said cover (22) having corresponding openings each mateable with each said threaded bolt (27);
    a peripheral sealing strip (28) mounted between said cover edge (31) of said cover (22) and said peripheral housing edge (25) of said lower housing part (21) during the installation of the air conditioning device (20);
    said cover (22) connectable with said lower housing part (21), a plurality of mounting bolts (32) each having a threaded reception mount (45), each said threaded bolt (27) secured to said cover (22) and mateable with each said threaded reception mount (45), and each said threaded reception mount (45) being axially adjustable;
    the mounting wall (11) having two ventilation openings (12, 13) for connecting air conditioning device components;
    a peripheral sealing strip (42) mounted between the mounting wall (11) and said lower housing part (21);
    said peripheral housing edge (25) of said housing side wall (24) having end sections (26) directed toward said cover (22) and parallel to said housing side wall (24) and said end sections (26) overlapping a connecting area between said lower housing part (21) and said cover (22);
    a cut-away section (15) within the mounting wall (11), said cut-away section (15) corresponding to external dimensions of said end sections (26) of said housing side wall (24) of said lower housing part (21); and
    a plurality of mounting through-holes (14) of the mounting wall (11) positioned around said cut-away section (15), said mounting through-holes (14) aligned with said threaded bolts (27) and said peripheral housing edge (25) of said housing side wall (24) of said lower housing part (21).

9. An air conditioning device in accordance with claim 8, wherein each said mounting bolt (32) is mounted in a U-shaped guide bracket (33) attached on an inner side of said cover side wall (30) of said cover (22), said mounting bolts (33) are conducted through guide bracket through-holes of lateral arms (34, 35) of said U-shaped guide brackets (33), each said mounting bolt (32) is axially adjustable with respect to each said U-shaped guide bracket (33), a plurality of safety elements (36, 37) are attached to each said mounting bolt (32) and limit axial movement of said mounting bolt (32); and
    said threaded reception mounts (45) accommodate said threaded bolts (27) of said lower housing part (21), and each said threaded reception mount (45) is mounted to a front side of said threaded bolt (32) which is oriented towards said lower housing part (21).

10. An air conditioning device in accordance with claim 9, wherein a slotted end (46) of each said mounting bolt (32) is oriented towards a top wall (29) of said cover (22), and said slotted ends (46) are accessible through a plurality of access openings (43) in said top wall (22).

11. An air conditioning device in accordance with claim 10, wherein a plurality of housed components are positioned in said lower housing part (21) and elements for air supply and air purification are housed in said cover (22).

12. An air conditioning device for a control panel having a lower housing part and an attachable cover for installation on a mounting wall (11), the air conditioning device comprising:
    said lower housing part (21) having a base (23);
    said lower housing part (21) having a housing open side, said cover (22) having a cover open side oriented toward said housing open side, a housing side wall (24) of said lower housing part (21) having an inwardly directed peripheral housing edge (25) on said housing open side, a cover side wall (30) of said cover (22) having an inwardly directed peripheral cover edge (31) on said cover open side;
    said peripheral housing edge (25) of said lower housing part (21) oriented toward said cover (22) and a plurality of threaded bolts (27) secured to said peripheral housing edge (25), said cover edge (31) of said cover (22) having corresponding openings each mateable with each said threaded bolt (27);
    a peripheral sealing strip (28) mounted between said cover edge (31) of said cover (22) and said peripheral housing edge (25) of said lower housing part

(21) during the installation of the air conditioning device (20);

said cover (22) connectable with said lower housing part (21), a plurality of mounting bolts (32) each having a threaded reception mount (45), each said threaded bolt (27) secured to said cover (22) and mateable with each said threaded reception mount (45), and each said threaded reception mount (45) being axially adjustably;

the mounting wall (11) having two ventilation openings (12, 13) for connecting air conditioning device components;

a peripheral sealing strip (42) mounted between the mounting wall (11) and said lower housing part (21);

said peripheral housing edge (25) of said housing side wall (24) having end sections (26) directed toward said cover (22) and parallel to said housing side wall (24) and said end sections (26) overlapping a connecting area between said lower housing part (21) and said cover (22);

the air conditioning device (20) being mounted in a cut-away section (15) of said mounting wall (11) and a top wall (29) having a border edge (58) separate from said cover (22);

a framework part of said cover (22) oriented towards said top wall (29), a peripheral edge (49) of said cover (22) directed inwardly with respect to said cover side wall (30);

a plurality of threaded pegs (51) protruding towards said top wall (29) and secured to said peripheral edge (49), a plurality of mounting through-holes (14) of the mounting wall (11) mateable with each said threaded peg (51) and said cut-away section (15) being secured with first nuts (52);

said top wall (29) having a plurality of top wall through holes each aligned and mateable with each corresponding said threaded peg (51), each said threaded peg (51) extending through an external side of said cover wall (29);

a circumferential sealing band (53) positioned between said peripheral edge (40) of the mounting wall (11) and said inner side of said top wall (29); and said top wall (29) connected with said framework of said cover (22) and the mounting wall (11) with a plurality of second nuts (54), each said second nut (54) mateable with each said threaded peg (51) projecting out of said top wall through holes of said top wall (29).

13. An air conditioning device in accordance with claim 12, wherein each said threaded peg (51) comprises a cap screw extending through said peripheral edge (49) of said cover (22), and a head of said cap screw is welded to said peripheral edge (49).

14. An air conditioning device in accordance with claim 12, wherein said peripheral edge (49) of said framework of said cover (22) has an end section (50) oriented parallel to said cover side wall (30) and covers a connection area between said cover (22) and said top wall (29).

15. An air conditioning device in accordance with claim 1, wherein said lower housing part (21) is attached to the mounting wall (11) with said connecting elements, each said connecting element in said base (23) of said lower housing part (21) is a threaded rivet (38) which is mateable with each of a plurality of threaded studs (39), and each of a plurality of mounting through-holes (14) is mateable with each corresponding said threaded stud (39), and said lower housing part (21) is attached to the mounting wall (11) with a plurality of threaded nuts (40) each mateable with each corresponding said threaded stud (39).

16. An air conditioning device in accordance with claim 15, wherein a peripheral sealing strip (42) is mounted between the mounting wall (11) and said lower housing part (21).

17. An air conditioning device in accordance with claim 1, further comprising:

said inwardly directed peripheral housing edge (25) of said housing side wall (24) having end sections (26) directed toward said cover (22) and parallel to said housing wall (24) and said end sections (26) overlapping a connecting area between said lower housing part (21) and said cover (22).

18. An air conditioning device for a control panel having a lower housing part and an attachable cover for installation on a mounting wall (11), the air conditioning device comprising:

said lower housing part (21) having a base (23);

said lower housing part (21) having a housing open side, said cover (22) having a cover open side oriented toward said housing open side, a housing side wall (24) of said lopwer housing part (21) having an inwardly directed peripheral housing edge (25) on said housing open side, a cover side wall (30) of said cover (22) having an inwardly directed peripheral cover edge (31) on said cover open side;

said peripheral housing edge (25) of said lower housing part (21) oriented toward said cover (22) and a plurality of threaded bolts (27) secured to said peripheral housing edge (25), said cover edge (31) of said cover (22) having corresponding openings each mateable with each said threaded bolt (27);

a peripheral sealing strip (28) mounted between said cover edge (31) of said cover (22) and said peripheral housing edge (25) of said lower housing part (21) during the installation of the air conditioning device (20);

said cover (22) connectable with said lower housing part (21), a plurality of mounting bolts (32) each having a threaded reception mount (45), each said threaded bolt (27) secured to said cover (22) and mateable with each said threaded reception mount (45), and each said threaded reception mount (45) being axially adjustable;

a cut-away section (15) within the mounting wall (11), said cut-away section (15) corresponding to external dimensions of end sections (26) of said housing side wall (24) of the lower housing part (21); and a plurality of mounting through-holes (14) of the mounting wall (11) positioned around said cut-away section (15), said mounting through-holes (14) aligned with said threaded bolts (27) and said peripheral housing edge (25) of said housing side wall (24) of said lower housing part (21).

19. An air conditioning device in accordance with claim 1, wherein mounting through-holes (14) of the mounting wall (11) are adjusted to correspond with a distribution of said connecting elements in said base (23) of said lower housing part (21), and said connecting elements each comprise a threaded rivet (38).

20. An air conditioning device in accordance with claim 19, wherein said threaded rivets (38) are non-rotatably secured in borings of said base (23) of said lower housing part (21).

21. An air conditioning device in accordance with claim 1, wherein each said mounting bolt (32) is mounted in a U-shaped guide bracket (33) attached on an inner side of said cover side wall (30) of said cover (22), said mounting bolts (32) are conducted through guide bracket through holes of lateral arms (34, 35) of said U-shaped guide brackets (33), each said mounting bolt (32) is axially adjustable with respect to each said U-shaped guide bracket (33), a plurality of safety elements (36, 37) are attached to each said mounting bolt (32) and limit axial movement of said mounting bolt (32); and said threaded reception mounts (45) accommodate said threaded bolts (27) of said lower housing part (21), and each said threaded reception mount (45) is mounted to a front side of said threaded bolt (32) which is oriented towards said lower housing part (21).

22. An air conditioning device in accordance with claim 21, wherein a slotted end (46) of each said mounting bolt (32) is oriented towards a top wall (29) of said cover (22), and said slotted ends (46) are accessible through a plurality of access openings (43) in said top wall (29).

23. An air conditioning device in accordance with claim 1, wherein a plurality of housed components are positioned in said lower housing part (21) and elements for air supply and air purification are housed in said cover (22).

24. An air conditioning device for a control panel having a lower housing part and an attachable cover for installation on a mounting wall (11), the air conditioning comprising:

said lower housing part (21) having a base (23);

said lower housing part (21) having a housing open side, said cover (22) having a cover open side oriented toward said housing open side, a housing side wall (24) of said lower housing part (21) having an inwardly directed peripheral housing edge (25) on said housing open side, a cover side wall (30) of said cover (22) having an inwardly directed peripheral cover edge (31) on said cover open side;

said peripheral housing edge (25) of said lower housing part (21) oriented toward said cover (22) and a plurality of threaded bolts (27) secured to said peripheral housing edge (25), said cover edge (31) of said cover (22) having corresponding openings each mateable with each said threaded bolt (27);

a peripheral sealing strip (28) mounted between said cover edge (31) of said cover (22) and said peripheral housing edge (25) of said lower housing part (21) during the installation of the air conditioning device (20);

said cover (22) connectable with said lower housing part (21), a plurality of mounting bolts (32) each having a threaded reception mount (45), each said threaded bolt (27) secured to said cover (22) and mateable with each said threaded reception mount (45), and each said threaded reception mount (45) being axially adjustable;

the air conditioning device (20) being mounted in a cut-away section (15) of the mounting wall (11) and a top wall (29) having a border edge (58) separate from said cover (22);

a framework part of said cover (22) oriented towards said top wall (29), a peripheral edge (49) of said cover (22) directed inwardly with respect to said cover side wall (30);

a plurality of threaded pegs (51) protruding toward said top wall (29) and secured to said peripheral edge (49), a plurality of mounting through-holes (14) of the mounting wall (11) mateable with each of said threaded peg (51) and said cut-away section (15) being secured with first nuts (52);

said top wall (29) having a plurality of top wall through holes each aligned and mateable with each corresponding said threaded peg (51), each of said threaded peg (51), extending through an external side of said cover wall (29);

a circumferential sealing band (53) positioned between said peripheral edge (40) of the mounting wall (11) and said inner side of said top wall (29); and said top wall (29) connected with said framework of said cover (22) and the mounting wall (11) with a plurality of second nuts (54), each said second nut (54) mateable with each said threaded peg (51) projecting out of said top wall through holes of said top wall (29).

25. An air conditioning device in accordance with claim 1, wherein each said threaded bolt (27) comprises a cap screw extending through said peripheral housing edge (25) and a head of said cap screw is welded to said peripheral housing edge (25) at a welding seam (48).

26. An air conditioning device in accordance with claim 12, wherein said peripheral edge (49) of said cover (22) has an end section (50) oriented parallel to said cover side wall (30) and covers a connection between said cover (22) and said top wall (29).

27. An air conditioning device in accordance with claim 1, wherein the air conditioning device is installed in a cut-away section (15) of the mounting wall (11) between said peripheral housing edge (25) of said lower housing part (21) and said peripheral sealing strip (28) and the mounting wall (11) are attached with a plurality of nuts (44) mateable with said threaded bolts (27).

* * * * *